TRANSISTOR RADIO RECEIVERS

Filed Sept. 16, 1958 2 Sheets-Sheet 1

INVENTOR.
JOHN B. SCHULTZ
BY
ATTORNEY

INVENTOR.
JOHN B. SCHULTZ
BY
[signature]
ATTORNEY

United States Patent Office 3,007,046
Patented Oct. 31, 1961

3,007,046
TRANSISTOR RADIO RECEIVERS

John B. Schultz, Folcroft, Pa., assignor to Radio Corporation of America, a corporation of Delaware Filed Sept. 16, 1958, Ser. No. 761,342
11 Claims. (Cl. 250—20)

Figure 1:
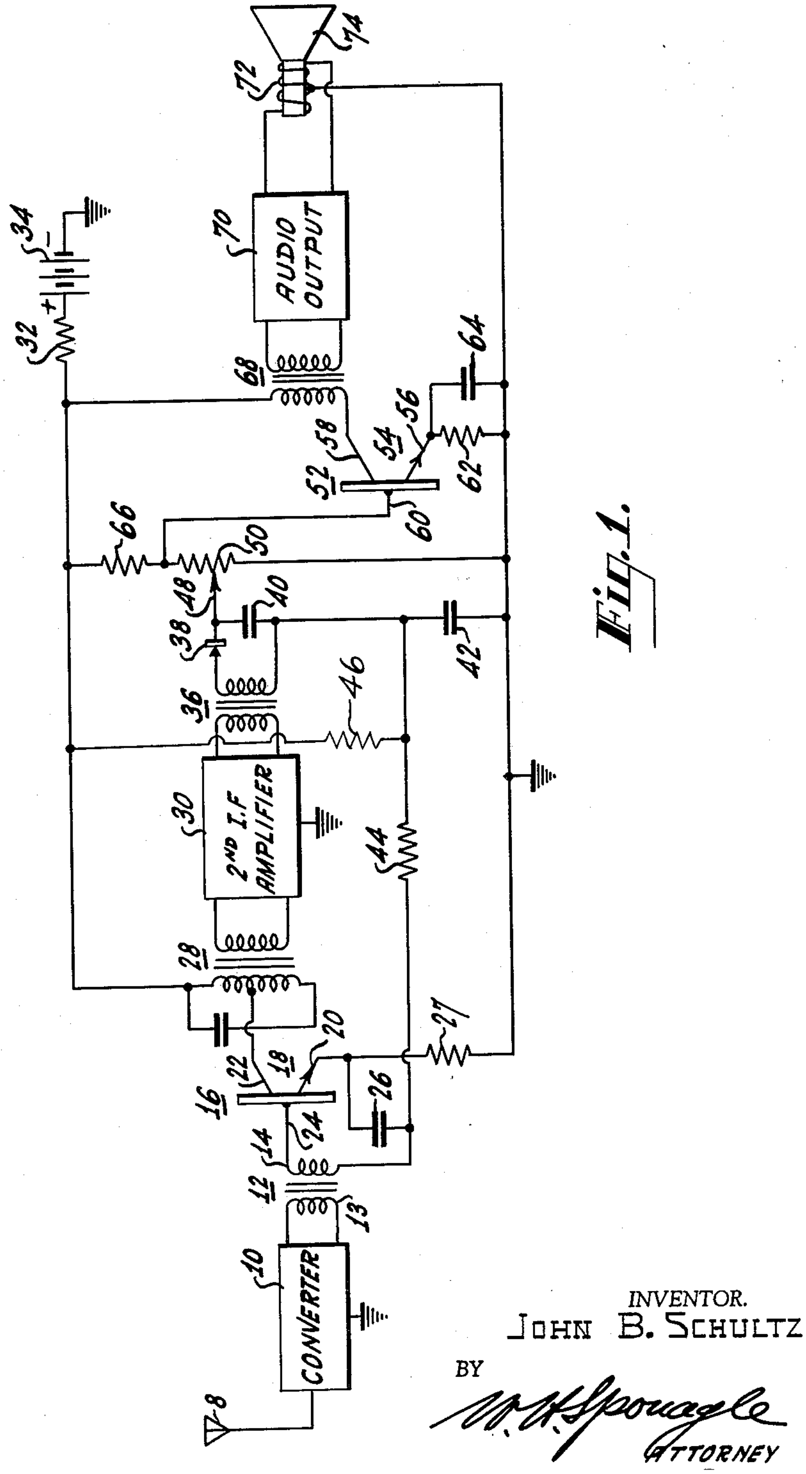

This invention relates to transistor radio receivers and in particular to improved volume control circuits for transistor radio receivers.

The usual commercial transistor radio receiver uses a diode as a second detector. The second detector diode is generally connected to the high signal voltage terminal of a volume control potentiometer. A variable tap on the volume control potentiometer is capacitively coupled to the input electrode (usually the base) of the audio driver transistor. The volume control resistor of the usual transistor receiver is relatively expensive since a relatively critical taper is needed in order to provide satisfactory minimum volume control for the receiver. In addition, the coupling capacitor, which is of the electrolytic type, is relatively expensive and bulky. The coupling capacitor has heretofore been considered necessary, however, in order to prevent variations of the direct biasing voltages of the audio driver transistor as the position of the tap on the volume control resistor is varied. Variations in the biasing voltages of the driver transistor are not desirable, since these variations alter the maximum signal handling capabilities of this stage.

It is, accordingly, an object of the present invention to provide an improved and simplified volume control circuit for a transistor radio receiver.

It is another object of the present invention to provide an improved diode detector and transistor audio amplifier circuit for use in a radio signal receiver.

It is a further object of the present invention to provide improved second detector, volume control, and audio driver circuits for a transistor radio receiver wherein the coupling capacitor usually used therein is eliminated.

It is still another object of the present invention to provide circuit means, including a volume control resistor, for effectively controlling the volume of a transistor radio receiver wherein circuit cost is reduced without impairing circuit performance.

The diode detector of a transistor radio receiver is connected, in accordance with the present invention, to a tap on a volume control resistor. The high signal voltage end of the volume control resistor is direct-current conductively connected with the input electrode of an audio driver transistor. A voltage divider network, which includes the volume control resistor, fixes the direct voltage on the input electrode of the audio driver transistor, thus permitting variations in the resistance between the tap of the volume control resistor and a point of reference potential in the receiver without changing the signal handling capabilities of the driver transistor. The detector is also connected with an intermediate-frequency transistor such that the gain of this amplifier is reduced for low volume control settings of the volume control resistor. By this arrangement, low volume control settings are obtainable without the need for a critically tapered volume control resistor.

Figure 2:
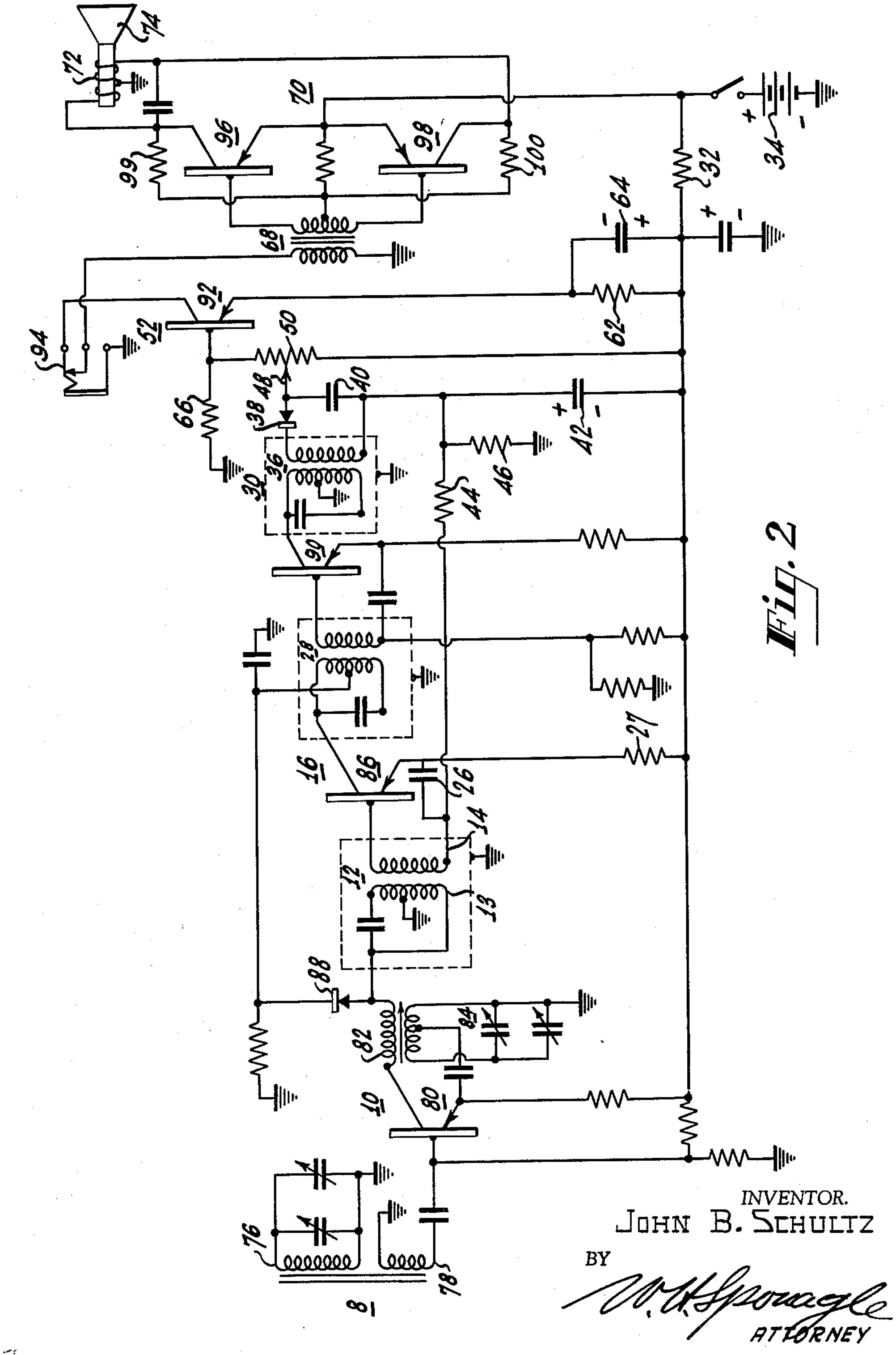

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings in which:

FIGURE 1 is a schematic circuit diagram, partially in block diagram form, of a transistor radio receiver embodying the present invention; and FIGURE 2 is a schematic circuit diagram of a transistor radio receiver embodying the present invention.

Referring now to the drawing, wherein like parts are indicated by like reference numerals in both figures, and referring particularly to FIGURE 1, the antenna 8 receives the incoming modulated radio frequency signal and couples this signal to a frequency converter stage 10. The converter 10 may contain a single transistor connected to generate a local oscillator signal and to mix the oscillator signal with the received radio frequency signal or it may contain separate oscillator and mixer transistors. It is also noted that a separate radio frequency amplifier stage may be used if desired. The converter stage 10 is coupled through a transformer 12, having a primary winding 13 and a secondary winding 14, to a first intermediate-frequency (I.F.) amplifier stage 16 including a transistor 18. The transistor 18 is of P type conductivity and may be considered to be, for example, an N-P-N junction transistor. The transistor 18 includes emitter 20, collector 22, and base 24 electrodes. The emitter 20 of the transistor 18 is connected to ground through a direct current degenerative stabilizing resistor 27.

One terminal of the secondary winding 14 of the transformer 12 is connected directly with the base 24 of the transistor 18. The remaining terminal of the secondary winding 14 is connected through a coupling capacitor 26 to the emitter 20 of the transistor 18. By these connections, the intermediate-frequency signal is applied between the base and emitter electrodes of the transistor 18, which is connected for common emitter operation. The collector 22 of the transistor 18 is coupled through a transformer 28, which includes a tuned primary winding, to a second intermediate-frequency amplifier 20, which may be substantially identical to the first intermediate-frequency amplifier stage 16. To provide direct collector biasing voltages for the transistor 18, the positive terminal of a direct current supply source, illustrated as a battery 34, is connected through a decoupling resistor 32 and a portion of the primary winding of the transformer 28 to the collector 22 of the transistor 18.

The second intermediate-frequency amplifier stage 30 is coupled through a transformer 36 to the second detector stage which comprises a diode detector 38. One terminal of the secondary winding of the transformer 36 is directly connected with the anode of the diode detector 38 while a filter capacitor 40 is connected from the cathode of the diode detector 38 to the remaining terminal of the secondary winding of the transformer 36. The anode of the diode 38 is also connected through the secondary winding of the transformer 36 and a biasing resistor 46 to the positive terminal of the battery 34. By this connection, a slight forward bias is provided for the diode detector 38, thus improving its detection effeciency. An AGC circuit is provided by connecting the anode of the diode detector 38 through the secondary winding of the transformer 36 and a filter resistor 44 and the secondary winding 14 of the first intermediate-frequency transformer 12 to the base 24 of the transistor amplifier 18. An AGC filter capacitor 42 is connected from the junction of the intermediate frequency filter capacitor 40 and the filter resistor 44 to ground.

The cathode of the diode detector 38 is also connected, in accordance with the present invention, to a variable tap 48 of a volume control resistor or potentiometer 50. The high signal voltage end of the volume control resistor 50 is direct-current conductively connected to the input of an audio frequency driver stage 52 which includes a transistor 54. The other terminal of the volumec ontrol resistor 50 is connected to a point of reference potential or ground.

The audio frequency driver transistor 54 is also of P type conductivity and may be considered to be a junction transistor of the N–P–N type and includes an emitter electrode 56, a collector electrode 58, and a base electrode 60. To provide a direct bias voltage for the base 60 of the driver transistor 54 which does not vary with variations in the amplitude of the intermediate frequency signal or variations in the resistance between the tap 48 of the volume control resistor 50 and ground, in accordance with the invention, the base 60 of the audio driver transistor is connected to the junction of the volume control resistor 50 and a biasing resistor 66, the other terminal of the resistor 66 being connected through the decoupling resistor 32 to the positive terminal of the supply battery 34. The resistor 66 and the volume control resistor 50 thus comprises a voltage divider or bleeder network which is connected between the terminals of the supply source or battery 34. This voltage divider provides a fixed direct voltage at the junction of the resistor 66 and the volume control resistor 50. This voltage is applied to the base electrode 60 so that the voltage on the base electrode 60 remains constant despite changes in the amplitude of the received signal or variations in the resistance between the tap 48 of the volume control resistor 50 and ground.

The collector electrode 58 of the driver transistor 54 is coupled through a transformer 68 to an audio output stage 70. To provide collector biasing voltage for the driver transistor 54, the positive terminal of the battery 34 is connected through the decoupling resistor 32 and the primary winding of the transformer 68 to the collector 58 of the driver transistor 54. The output terminals of the audio output stage 70 are connected to the terminals of a voice coil 72 of a loudspeaker 74. A center tap on the voice coil is connected directly to ground. The audio output stage 70 is operative to provide a push-pull signal through the loudspeaker voice coil 72. This signal is reproduced as an audible signal by the loudspeaker 74.

In operation, the intermediate frequency signal is detected by the diode detector 38. An audio frequency signal is thus provided which is applied between the base 60 and emitter 56 of the audio driver transistor 54. The audio frequency signal is amplified by the audio frequency output stage 70 and reproduced as an audible signal by the loudspeaker 74. Assume that the amplitude of the received signal and thus of the intermediate frequency signal, which is applied to the second detector 38, increases in amplitude. The diode detector 38 will become more conductive on positive half cycles of the intermediate frequency signal and the voltage across the resistor 46 will increase. The potential at the cathode of the diode detector is clamped at a value determined by the position of the variable tap 48 on the volume control resistor 50. Thus, the voltage at the anode of the diode detector becomes more negative as the received signal increases in amplitude. Since the anode of the diode detector 38 is connected through the AGC circuitry to the base 24 of the first I.F. transistor 18, the base voltage of this transistor becomes less positive as the signal strength increases, thus reducing the gain of this transistor. This provides automatic gain control action to maintain the amplitude of the intermediate frequency signal, which is applied to the diode detector, substantially constant.

As the variable tap 48 is moved toward the grounded (negative terminal) of the volume control resistor 50, less audio frequency signal is applied between the base and emitter electrodes of the audio frequency driver transistor 54. This results in less audio output. Insofar as the direct base voltage of the audio frequency driver transistor 54 is concerned, however, the resistance of the resistor 66 and of the volume control resistor 50 are made small enough so that variations in the base current of either the intermediate frequency transistor amplifier 18 or of the audio frequency driver transistor 54 do not affect the base voltage of the transistor 54. In addition, the bleeder current, which is determined by the voltage of the supply source relative to the resistance of the resistors 66 and 50, must be large compared to the base current of the intermediate frequency transistor 18. The circuit parameters of the divider network are selected to meet these conditions so that variations of the resistance between the tap 48 and ground by varying the position of the tap 48 on the volume control resistor 50 will not vary the base voltage of the driver transistor 54. For low volume control settings, that is as the volume control tap 48 is moved toward ground, or the negative terminal of the supply battery, the direct base voltage of the first intermediate frequency transistor 18 becomes less positive. Thus, the gain of the first intermediate frequency amplifier transistor 18 will decrease as the volume control is decreased. The first intermediate frequency amplifier transistor 18 can actually be cut-off by moving the variable tap 48 to the grounded end of the volume control resistor 50. Thus, effective volume control is provided and low volume control settings are easily obtainable without the need for a relatively expensive tapered volume control potentiometer. Because the base 60 of the driver transistor 54 is maintained at a constant voltage, the maximum signal handling capabilities of this stage are realized. This accomplished moreover, without the need for the usual expensive and bulky electrolytic coupling capacitor.

A complete schematic circuit diagram of a radio receiver is illustrated in FIGURE 2, reference to which is now made. The transistors used in the receiver of FIGURE 2 are all of the P-N-P junction type as opposed to the N-P-N transistors of FIGURE 1, but like the receiver of FIGURE 1 a positive direct current supply source is used. The antenna 8 is of the ferrite loop type and includes an input or pickup winding 76 and a coupling winding 78, which is capacitively coupled to the base electrode of a frequency converter transistor 80. The converter transistor 80, which has an oscillator coil 82 connected with its collector and a tuned circuit 84 coupled to its emitter to provide regenerative feedback between the collector and emitter electrodes, is thus operative to generate a local oscillator signal. This signal is mixed with the received radio frequency signal to provide an intermediate frequency signal. The intermediate frequency signal is coupled through the transformer 12 to the first intermediate frequency amplifier stage 16, which includes a P-N-P transistor 86. The transistor 86 is connected for common emitter operation in a manner similar to the first intermediate frequency amplifier transistor 18 of FIGURE 1.

To prevent signal overload of the receiver during the reception of large amplitude signals, a diode 88 is connected from the junction of the oscillator coil 82 and the primary circuit of the coupling transformer 12 to a tap on the primary winding of the intermediate frequency coupling transformer 28. The diode 88 is reverse biased and non-conductive at low input signals, but conducts when the received signal exceeds a predetermined maximum amplitude to provide a low impedance signal path, thus shunting the signal and preventing signal overload. The first intermediate frequency amplifier transistor 86 is coupled through the transformer 28 to a second intermediate frequency amplifier stage comprising a transistor 90. The transistor 90, which is of the P-N-P junction type, is connected for common emitter operation in a manner similar to the first intermediate frequency transistor 86.

The second intermediate frequency transistor amplifier 90 is coupled through a transformer 36 to the diode detector 38. The diode detector 38 is connected through the volume control variable tap 48 and the volume control resistor 50 to the audio driver stage 52, which includes a transistor 92 of the P-N-P type. The collector of the audio driver transistor 92 is connected through a jack 94 and the primary winding of a transformer 68 to ground. The jack 94 is adapted to receive the plug of an earphone in the event the listener prefers to use the receiver in this manner. The secondary winding of the transformer 68 is connected to the base electrodes of a pair of output transistors 96 and 98, which comprise the audio frequency output stage 70. The collector electrodes of the transistors 96 and 98 and connected to the terminals of the center-tapped voice coil 72 of the loudspeaker 74. Respective feedback resistors 99 and 100 provide direct-current feedback from the collectors to the base electrodes of the output transistors in response to voltage variations across the resistance of the voice coil as described and claimed in a copending application of John B. Schultz, Serial No. 738,446, filed May 28, 1958, which is now Patent No. 2,959,640, issued November 8, 1960, for Push-Pull Amplifier Circuits. In this manner, the direct current operating point of the output transistors is stabilized.

It is to be noted that the circuit of FIGURE 2, like the circuit of FIGURE 1, uses a positive supply source. Since P-N-P transistors are used rather than N-P-N transistors, however, the positive terminal of the supply is connected with the emitter electrodes of the transistors and the collectors of the transistors are grounded. In the circuit of FIGURE 1, on the other hand, the positive terminal is connected with the collector electrodes and the emitters are grounded. If a negative supply were required or desired for the circuit of FIGURE 2, connections of FIGURE 1 could be used by reversing the polarity of the battery 34. It is also to be noted that the diode detector 38 of FIGURE 2 is poled in an opposite direction to its counterpart of FIGURE 1.

The volume control and AGC circuit of FIGURE 2 operates in the same manner as the circuit of FIGURE 1, except that the polarity of the various voltages is reversed. Operation of the type described has been obtained using the following circuit specifications:

| | |
|---|---|
| Resistors **27, 32, 44, 46, 50, 62** and **66** | 330; 47; 1,000; 47,000; 2,500; 180; and 15,000 ohms, respectively. |
| Capacitors **26, 40** and **42** | .047, .047, and 10 microfarads, respectively. |
| Battery **34** | 4.5 volts. |
| Diode **38** | Type 1N295. |
| Transistor **86** | Type 2N410. |
| Transistor **92** | Type 2N406. |

As described herein, improved volume control and AGC circuitry for a radio receiver permits the elimination of a coupling capacitor and the use of a volume control resistor of less critical construction, without impairing the performance of the receiver. Thus, a radio receiver having circuitry of the type embodying this invention is characterized by quality of performance and relatively economical manufacturing cost.

What is claimed is:

1. In a radio receiver the combination with a transistor intermediate frequency amplifier, of a second detector diode connected to provide an audio frequency signal in response to intermediate frequency signals, a transistor audio frequency amplifier, means including a volume control resistor direct-current conductively connecting said detector diode with said transistor audio frequency amplifier to provide a signal transfer path for audio frequency signals, means providing a fixed bias voltage for said transistor audio frequency amplifier, and means connecting said diode detector with said transistor intermediate frequency amplifier to control the gain thereof as a function of the amplitude of said intermediate frequency signal and to vary the direct bias voltage and gain thereof with variations in the volume control setting of said volume control resistor.

2. In a radio receiver including a plurality of transistor amplifying stages the combination comprising, a diode detector, a volume control resistor, means including a variable tap connecting said diode detector with said volume control resistor, an audio amplifier transistor, means direct-current conductively connecting said volume control resistor with said audio amplifier transistor to provide a signal transfer path for audio frequency signals, means including said volume control resistor for fixing the bias voltage of said audio amplifier transistor despite variations in the position of said tap on said volume control resistor, and direct-current conductive means connecting said diode detector with one of said plurality of transistor amplifying stages to automatically reduce the gain thereof in response to signals of predetermined amplitude and to vary the direct biasing voltage and gain thereof with variations in the resistance of said volume control resistor.

3. In a radio receiver including a plurality of transistor amplifying stages the combination comprising, a diode detector, a direct current supply source having a pair of terminals, a voltage divider network comprising a volume control resistor and a bias resistor connected between the terminals of said supply source to provide a direct voltage of predetermined fixed amplitude, means including a variable tap direct-current conductively connecting said diode detector with said volume control resistor, an audio amplifier transistor, means for applying said direct voltage to said audio amplifier transistor, and direct-current conductive means connecting said diode detector with one of said plurality of transistor amplifying stages to automatically reduce the gain thereof in response to signals of predetermined amplitude and to vary the direct biasing voltage and gain thereof with variations in the volume control setting of said volume control resistor.

4. In a radio receiver, the combination comprising, an intermediate frequency amplifier transistor, a diode detector, an audio frequency amplifier transistor, and means providing volume control of said receiver by simultaneously varying the amount of signal applied to said audio frequency amplifier and the bias voltage and gain of said intermediate frequency amplifier transistor, said means including a variable volume control resistor direct-current conductively connected between said diode detector and said audio frequency amplifier transistor.

5. In a radio receiver the combination with a transistor intermediate frequency amplifier including base, emitter, and collector electrodes and connected for common emitter amplifying operation, of a second detector diode connected to provide an audio frequency signal in response to intermediate frequency signals, a transistor audio frequency amplifier including base, emitter, and collector electrodes and connected for common emitter amplifying operation, means including a volume control resistor direct-current conductively connecting said detector diode with the base of said transistor audio frequency amplifier, means providing a fixed bias voltage for the base of said transistor audio frequency amplifier, and means connecting said diode detector with the base of said transistor intermediate frequency amplifier to control the gain thereof as a function of the amplitude of said intermediate frequency signal and to vary the direct base bias voltage and gain thereof with variations in the volume control setting of said volume control resistor.

6. In a radio receiver the combination with an intermediate frequency amplifier transistor including base, emitter, and collector electrodes, a second detector, a volume control resistor including a variable tap, and an audio frequency amplifier transistor having at least a base electrode; of means connecting the base of said intermediate frequency amplifier transistor, said second detector, said variable tap and the base electrode of said audio frequency amplifier transistor in series for direct-current to provide automatic gain control of said intermediate frequency amplifier transistor in response to variations in the amplitude of received signals and to provide variation in the base voltage and gain of said intermediate frequency amplifier transistor in response to variation in the position of said variable tap on said volume control resistor.

7. In a radio receiver including an intermediate frequency amplifier the combination comprising, a diode detector, a volume control resistor, means including a variable tap direct-current conductively connecting said diode detector with said volume control resistor, an audio frequency amplifier transistor, means direct current conductively connecting the high signal voltage terminal of said volume control resistor with said audio frequency amplifier transistor, means including said volume control resistor providing a voltage divider network for fixing the bias voltage of said audio frequency amplifier transistor despite variations in the position of said variable tap on said volume control resistor, and direct-current conductive means connecting said diode detector with said intermediate frequency amplifier transistor to automatically reduce the gain thereof in response to signals of predetermined amplitude and to vary the direct biasing voltage and gain thereof with variations in the position of said variable tap on said volume control resistor.

8. In a radio receiver the combination with an intermediate frequency amplifier transistor including base, emitter and collector electrodes and connected for common emitter operation, of a second detector diode including a pair of electrodes and connected to provide an audio frequency signal in response to intermediate frequency signals, an audio frequency amplifier transistor including base, emitter, and collector electrodes and connected for common emitter operation, a volume control resistor including a pair of terminals and a variable tap, means direct-current conductively connecting one electrode of said detector diode with the tap of said volume control resistor, a direct current supply source having a pair of terminals, means connecting one terminal of said volume control resistor with one terminal of said source, means including a bias resistor connecting the other terminal of said volume control resistor with the other terminal of said source, said volume control and bias resistors comprising a voltage divider network to provide a fixed direct voltage of predetermined amplitude, means direct-current conductively connecting the junction of said volume control and bias resistors to the base of said audio frequency amplifier transistor to apply said fixed voltage thereto to prevent variations in the signal handling capability of said audio frequency amplifier transistor with variation in the position of said variable tap on said volume control resistor, and means connecting the other electrode of said diode detector with the base of said transistor intermediate frequency amplifier to control the gain thereof as a function of the amplitude of said intermediate frequency signal and to vary the direct base bias voltage and gain thereof with variations in the position of said variable tap on said volume control resistor.

9. In a transistor radio receiver including an intermediate frequency amplifier having at least an input electrode, a second detector, and an audio frequency amplifier having at least an input electrode; the combination comprising, means providing a series direct current conductive volume and gain-control path including in the order named the input electrode of said intermediate frequency amplifier, said second detector, a volume control resistor, and the input electrode of said audio frequency amplifier; and means for varying the volume control setting of said volume control resistor to vary the amount of signal applied to said audio frequency amplifier and the bias voltage of said intermediate frequency amplifier.

10. In a radio receiver, the combination comprising, a second detector including unidirectional conducting means connected to provide an audio frequency signal in response to intermediate frequency signals, a transistor audio frequency amplifier, a volume control resistor having a variable tap, means direct-current conductively connecting said unidirectional conducting means with said variable tap, means connecting the high signal voltage terminal of said volume control resistor with said transistor audio frequency amplifier, a voltage divider including resistive means and said volume control resistor connected in series across a source of potential for providing a fixed bias voltage for said transistor audio frequency amplifier despite variations in the position of said variable tap on said volume control resistor, and means for deriving an automatic gain control signal from said unidirectional conducting means in response to said intermediate frequency signals.

11. In a radio receiver including an intermediate frequency amplifier transistor the combination comprising, a diode detector, a direct current supply source including a pair of terminals, means providing a bias voltage of predetermined fixed amplitude including a volume control resistor and a bias resistor connected in series between the terminals of said supply source, an audio amplifier transistor including base, emitter, and collector electrodes and connected for common emitter amplifying operation, means including a variable tap direct-current conductively connecting said diode detector with said volume control resistor, means for applying said bias voltage to the base of said audio amplifier transistor for fixing the base bias voltage thereof despite variations in the position of said volume control resistor, and direct-current conductive means connecting said diode detector with said intermediate frequency amplifier transistor to automatically reduce the gain thereof in response to signals of predetermined amplitude and to vary the direct biasing voltage and gain thereof with variations in the position of said variable tap of said volume control resistor.

References Cited in the file of this patent

UNITED STATES PATENTS

| | | |
|---|---|---|
| 2,789,164 | Stanley | Apr. 16, 1957 |
| 2,834,878 | Burns et al. | May 13, 1958 |
| 2,866,859 | Stanley | Dec. 30, 1958 |
| 2,866,892 | Barton | Dec. 30, 1958 |

OTHER REFERENCES

RCA Technical Notes: RCA TN No. 30, by Holmes, Aug. 9, 1957.